(12) United States Patent
Pullela et al.

(10) Patent No.: US 7,009,438 B2
(45) Date of Patent: Mar. 7, 2006

(54) TRANS-ADMITTANCE TRANS-IMPEDANCE LOGIC FOR INTEGRATED CIRCUITS

(75) Inventors: Rajasekhar Pullela, West Lake Village, CA (US); Mario Reinhold, Nuremberg (DE)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 10/033,525

(22) Filed: Dec. 28, 2001

(65) Prior Publication Data

US 2002/0163374 A1 Nov. 7, 2002

Related U.S. Application Data

(63) Continuation-in-part of application No. 09/746,989, filed on Dec. 22, 2000, now abandoned, which is a continuation-in-part of application No. 09/415,602, filed on Oct. 8, 1999, now Pat. No. 6,297,706.

(51) Int. Cl.
*H03K 3/02* (2006.01)
(52) U.S. Cl. .................. 327/199; 327/327; 327/201
(58) Field of Classification Search ............... 327/193, 327/103, 109, 185, 199–204
See application file for complete search history.

(56) References Cited

U.S. PATENT DOCUMENTS

| 3,917,959 | A | * | 11/1975 | Swiatowiec et al. | ........ 377/107 |
|---|---|---|---|---|---|
| 4,276,488 | A | * | 6/1981 | Benedict et al. | ............ 327/202 |
| 4,492,931 | A | * | 1/1985 | Deweck | ...................... 330/294 |
| 4,818,952 | A | | 4/1989 | Kawano et al. | |
| 4,872,209 | A | * | 10/1989 | Blanken | ..................... 330/294 |
| 5,103,117 | A | | 4/1992 | Voorman et al. | |
| 5,581,215 | A | | 12/1996 | Ogasawara | |
| 5,606,490 | A | * | 2/1997 | Hong | ....................... 363/56.03 |
| 6,023,363 | A | * | 2/2000 | Harada et al. | ................ 330/75 |
| 6,140,845 | A | | 10/2000 | Benachour | |
| 6,420,912 | B1 | * | 7/2002 | Hsu et al. | .................... 327/103 |
| 6,538,486 | B1 | * | 3/2003 | Chen et al. | ................. 327/202 |

OTHER PUBLICATIONS

Ohhata et al; "Design of a 32.7-Ghz Bandwidth AGC Amplifier IC with Wide Dynamic Range Implemented in SiGe HBT"; IEEE Journal of Solid-State Circuits, vol. 34, No. 9, Sep. 1999.

* cited by examiner

*Primary Examiner*—Dinh T. Le (57) ABSTRACT

A logic circuit with improved performance when operating at the limits of the transistor's bandwidth. In particular, a latch includes a clocked trans-admittance stage circuit for receiving a voltage and producing a current output, and an active load, such as a trans-impedance stage circuit, connected to receive as input the current output of the trans-admittance stage circuit and produce a voltage output. Two independent trans-admittance and trans-impedance stages may be combined as a single latch pair. One or more latch pairs may be arranged in series as a cascaded chain and connected to the output current of a clocked trans-admittance stage latch.

19 Claims, 10 Drawing Sheets

*FIG. 1*
PRIOR ART

FIG. 2A
PRIOR ART
TAS LATCH

FIG. 2B

RL-TAS LATCH

FIG. 2C

FIG. 3A
TAS-TIS

FIG. 3B
DUAL TAS-TIS

DUAL TAS

TRANS-ADMITTANCE TRANS-IMPEDANCE LOGIC FOR INTEGRATED CIRCUITS

CROSS-REFERENCE TO RELATED APPLICATIONS

This application is a continuation-in-part of U.S. Ser. No. 09/746,989, filed on Dec. 22, 2000, now abandoned which is a continuation-in-part of U.S. Ser. No. 09/415,602, filed on Oct. 8, 1999, now U.S. Pat. No. 6,297,706, both applications are herein incorporated by reference in their entirety.

FIELD OF THE INVENTION

The present invention relates to an improved integrated circuit, and in particular, to an integrated circuit that enhances the performance of logic gates when operating at the limits of the transistor bandwidth.

DESCRIPTION OF THE RELATED ART

Figure 1:
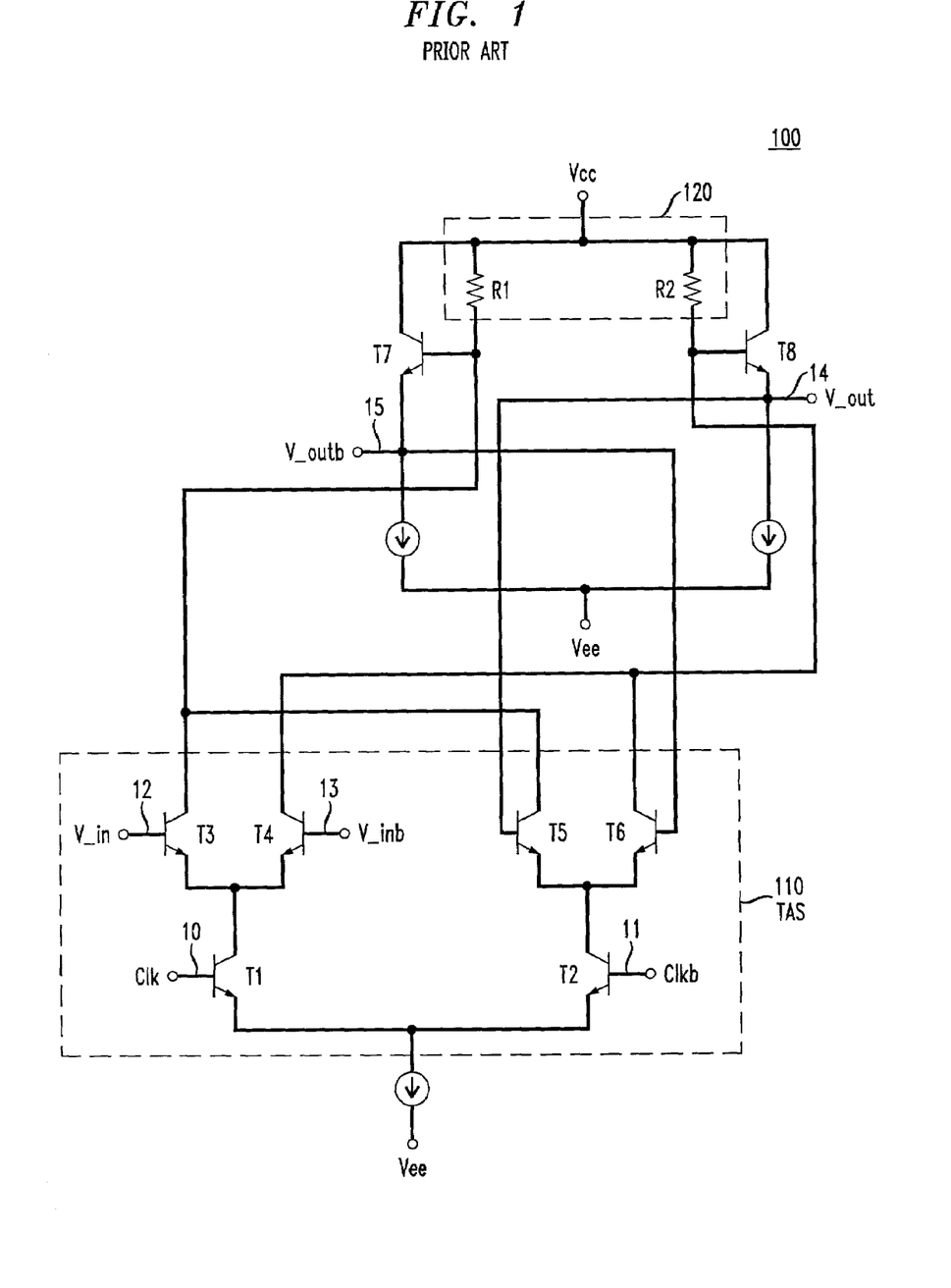
FIG. 1 is a prior art logic gate circuit.

FIG. 1 is a conventional logic gate 100, such as an emitter-coupled logic (ECL) or current-mode-logic (CCL) integrated circuit, that may be cascaded in a chain. This conventional logic block receives input voltage signals and produces output voltage signals. Each logic gate includes a current switching stage or clocked trans-admittance stage (TAS) 110 comprising transistors T1, T2, T3, T4, T5, T6; a passive load resistance 120 comprising resistors R1, R2; and two emitter follower transistors T7, T8 that buffer the wire/fan-out capacitance driven by the logic gate and provide level-shifting. This conventional logic gate is disadvantageous in that the use of a passive load 120 does not produce enough gain at the limit of transistor bandwidth, e.g., gain greater than one. At multi-GHz frequencies the wires have significant transit delay (time of flight). The impedance mismatch between the line impedance and the emitter-follower results in multiple reflections that degrade the signal at the input of the next logic gate. To reduce or eliminate impedance mismatch wires are implemented on the collectors of the transistors T3, T4, T5, T6. The resistance times the line capacitance from the wires on the collector nodes of the transistors reduces the peak clock frequency.

It is therefore desirable to develop a logic gate that is better suited for signal routing and less sensitive to capacitance from wiring while providing more gain at a higher bandwidth.

SUMMARY OF THE INVENTION

The present invention is directed to a logic circuit that solves the aforementioned problems.

In particular, the invention relates to a latch including a clocked trans-admittance stage circuit for receiving a voltage and producing a current output, and an active load, such as a trans-impedance stage circuit, connected to receive as input the current output of the trans-admittance stage circuit and produce a voltage output.

The invention is also directed to a cascaded latch chain including a clocked trans-admittance stage latch receiving an input voltage and producing an output current. In a further embodiment, the latch chain may also include a trans-impedance circuit and one or more latch pairs, with each pair having two independent trans-admittance and trans-impedance stages.

Yet another aspect of the invention relates to a latch pair including two independent combined trans-admittance and trans-impedance stages, with each latch pair clocked to opposite phases of a clock signal.

BRIEF DESCRIPTION OF THE DRAWINGS

The foregoing and other features of the present invention will be more readily apparent from the following detailed description and drawings of illustrative embodiments of the invention wherein like reference numbers refer to similar elements throughout the several views and in which:

FIG. 4b is a logic gate symbol for the clocked TAS latch of FIG. 4a.

DETAILED DESCRIPTION OF THE INVENTION

Figure 2A:
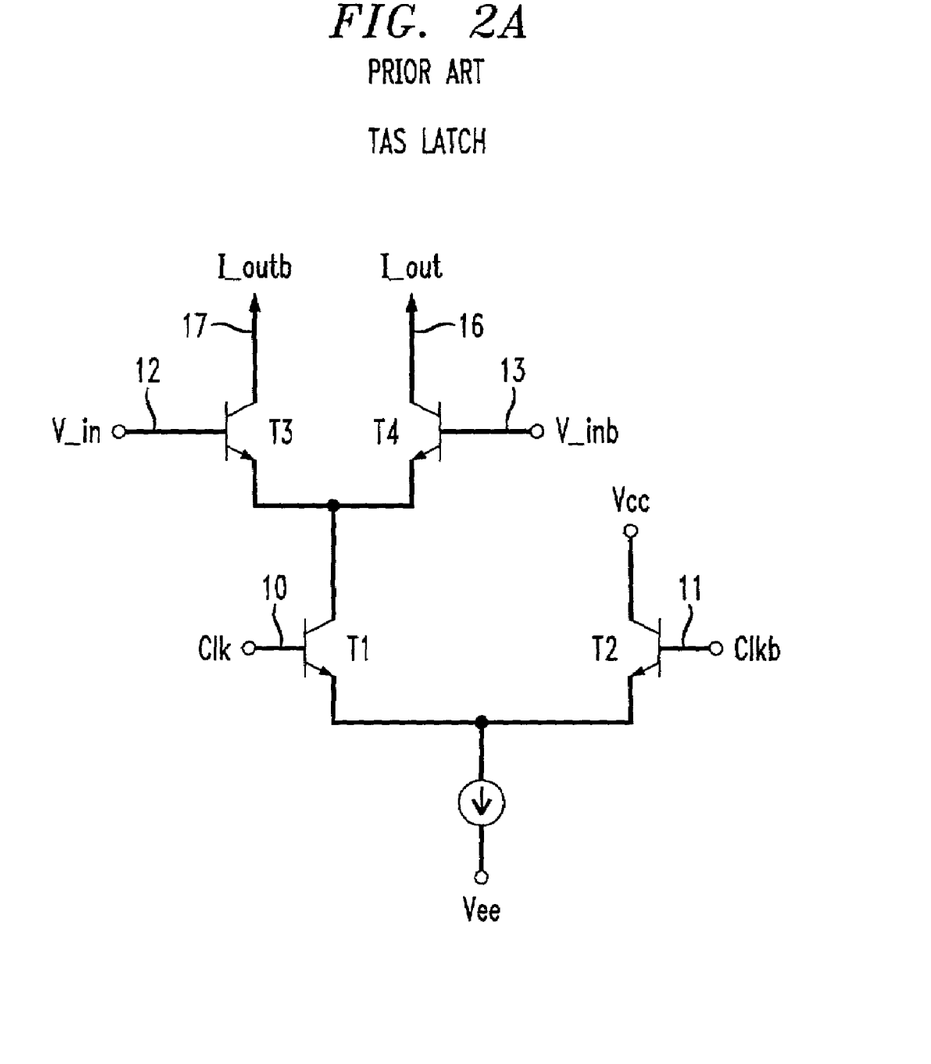
FIG. 2a is an exemplary TAS latch.
Figure 2B:
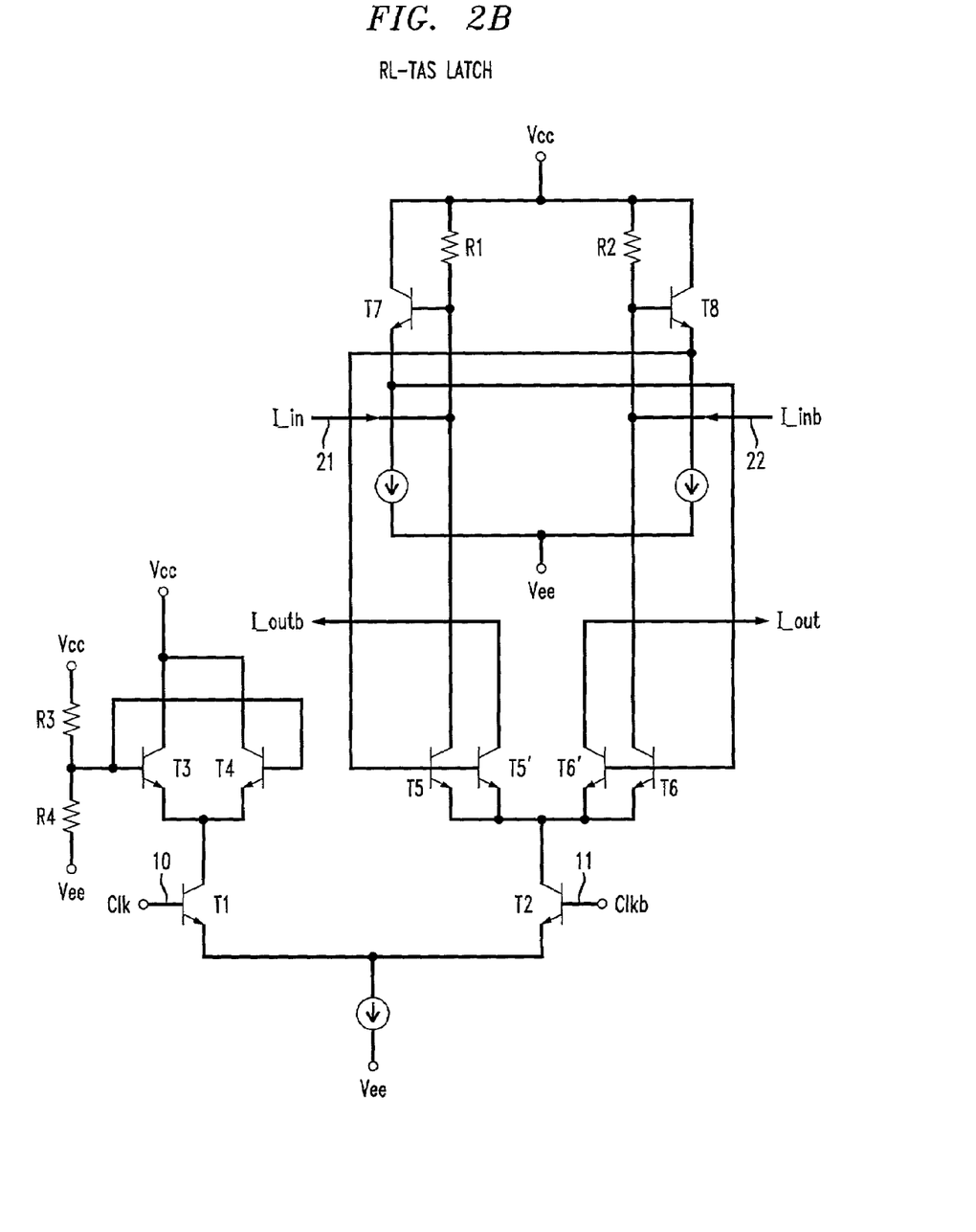
FIG. 2b is an exemplary RL-TAS latch.

To increase the gain of a conventional logic circuit the passive load resistance 120 in FIG. 1 may be replaced with an active load resistance, such as a trans-impedance stage. An active load resistance provides more gain at a higher bandwidth. A digital circuit comprising several conventional digital gates as shown in FIG. 1 is divided into blocks and regrouped to provide current rather than voltage interfaces at the inputs and outputs. Current interfaces are better suited for signal routing as the capacitance on the signal lines has minor impact on circuit speed and does not degrade circuit stability. In particular, the digital circuit is divided into a latch chain comprising a TAS latch connected in series to one or more RL-TAS latches. FIG. 2a is a circuit diagram of the TAS latch formed by transistors T1, T2, T3, T4 that receives clocked signals (e.g., clock (clk) and clock bar (clkb)), an input voltage Vin, Vinb and produces an output current Iout, Ioub. The circuit diagram for the RL-TAS latch, as shown in FIG. 2b, comprises an RL passive resistance load block of resistors R1, R2 and the TAS block formed by transistors T1, T2, T3, T4, T5, T6. Also included in the RL-TAS latch are emitter followers T7, T8. The RL-TAS latch receives a current input Iin, Iinb from the first TAS latch in the chain and produces a current output Iout, Ioutb.

Figure 2C:
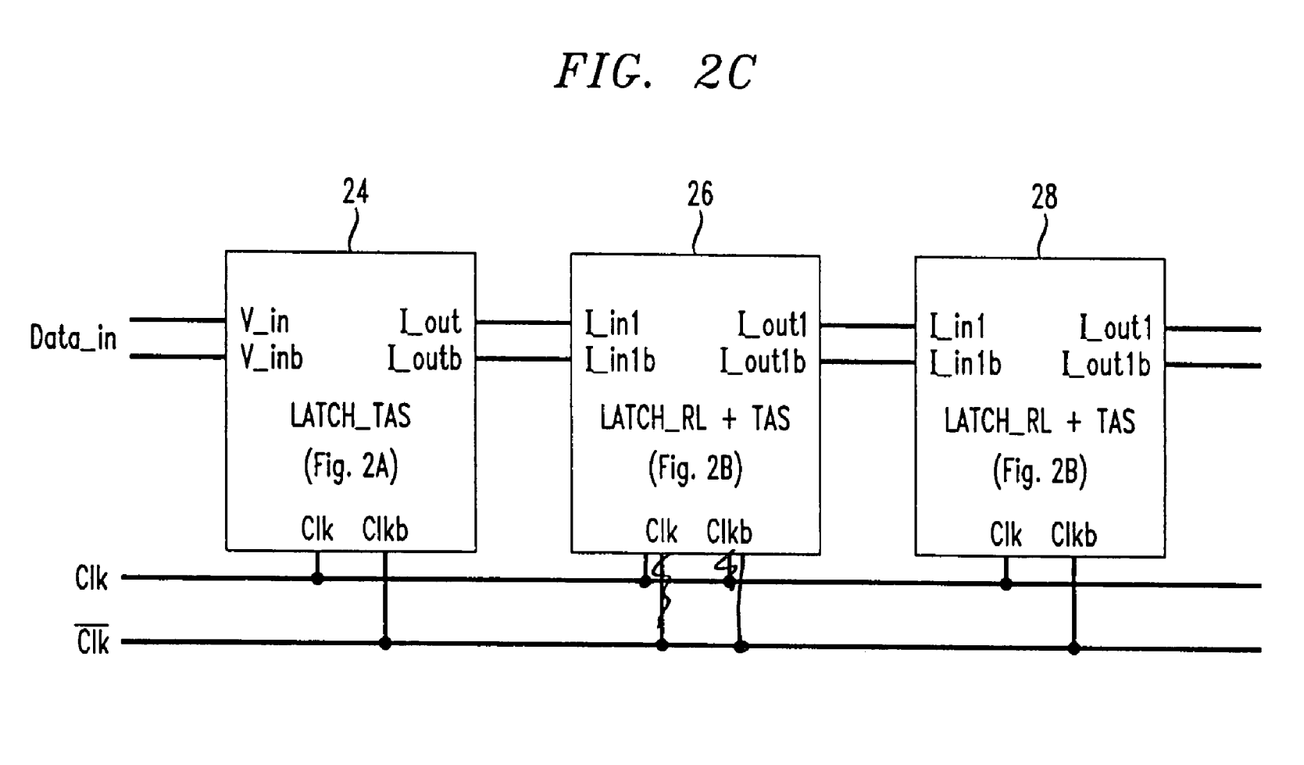
FIG. 2c is a logic gate symbol for an exemplary cascaded chain comprising a TAS latch and two RL-TAS latches.

A chain may be formed by cascading a series of RL-TAS latches clocked on opposite phases of the system clock. FIG. 2c is an exemplary symbol diagram of a cascaded latch chain in accordance with the present invention. The first TAS latch in the chain receives an input voltage Vin, Vinb and produces a current output Iout, Ioutb. By way of example, the chain in FIG. 2c has two RL-TAS latches, however, any number of one or more RL-TAS latches may be cascaded together, as desired. Each RL-TAS latch receives a current Iin1, Iin1b and produces a current output Iout1, Iout1b.

Figure 3A:
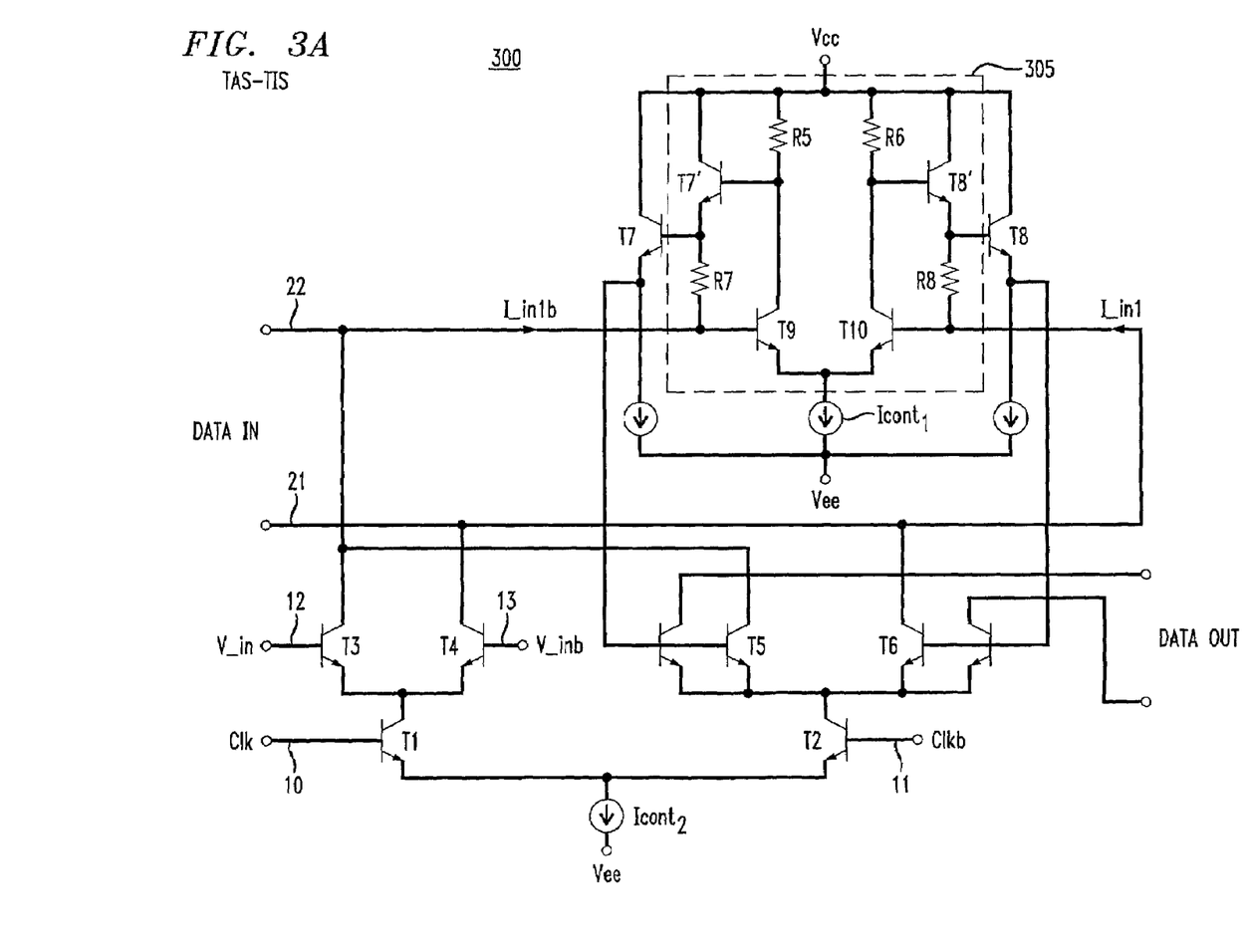
FIG. 3a is an exemplary single stage TAS-TIS latch.

In accordance with the present invention, the load resistors in the RL-TAS latch, shown in FIG. 2b, can be replaced with an active resistance load, for example, a trans-impedance amplifier stage (TIS). FIG. 3a is a TAS-TIS latch in which the passive load resistance RL comprising R1, R2 has been replaced with an active TIS load including transistors T7', T8', T9', T10 and resistors R5, R6, R7, R8. The TIS load converts an input current to an output voltage.

Logic gates configure in accordance with the present invention are less sensitive to transistor collector capacitance and/or wiring capacitance on the collectors of the transistors T3, T4, T5, T6. In addition, the topology shown in FIG. 3a provides a convenient node in the circuit that can be used for input/output connections between logic gates. Specifically, logic gates in accordance with the present invention are arranged to have a TIS input stage and a TAS output stage. Here, element 305 is an exemplary TIS block or latch that is configured in accordance with the present invention. Thus, the current from the switched TAS output is received by the TIS input stage of the next logic block in the cascaded logic chain. A TIS block or latch is also shown in the incorporated U.S. Pat. No. 6,297,706, e.g., see element 24 of FIGS. 2 and 3. See also, the description at: col. 2, lines 46–54.

A gain greater than one is required in order to propagate a digital signal along a chain of logic gates. The TAS-TIS logic gate in accordance with the present invention provides more differential gain than conventional logic gates operating at maximum frequency. In addition, the bandwidth or corner frequency for gain roll-off is extended by the TAS-TIS logic gate relative to that achieved using conventional logic gates. The TAS-TIS logic gate also provides more common-mode rejection between gates than with conventional logic gates. Improved noise or spurious signal rejection may also be obtained using the TAS-TIS logic gate construction. This characteristic is particularly advantageous at relatively high frequency where noise or spurious signals may be coupled into the circuit.

Figure 3B:
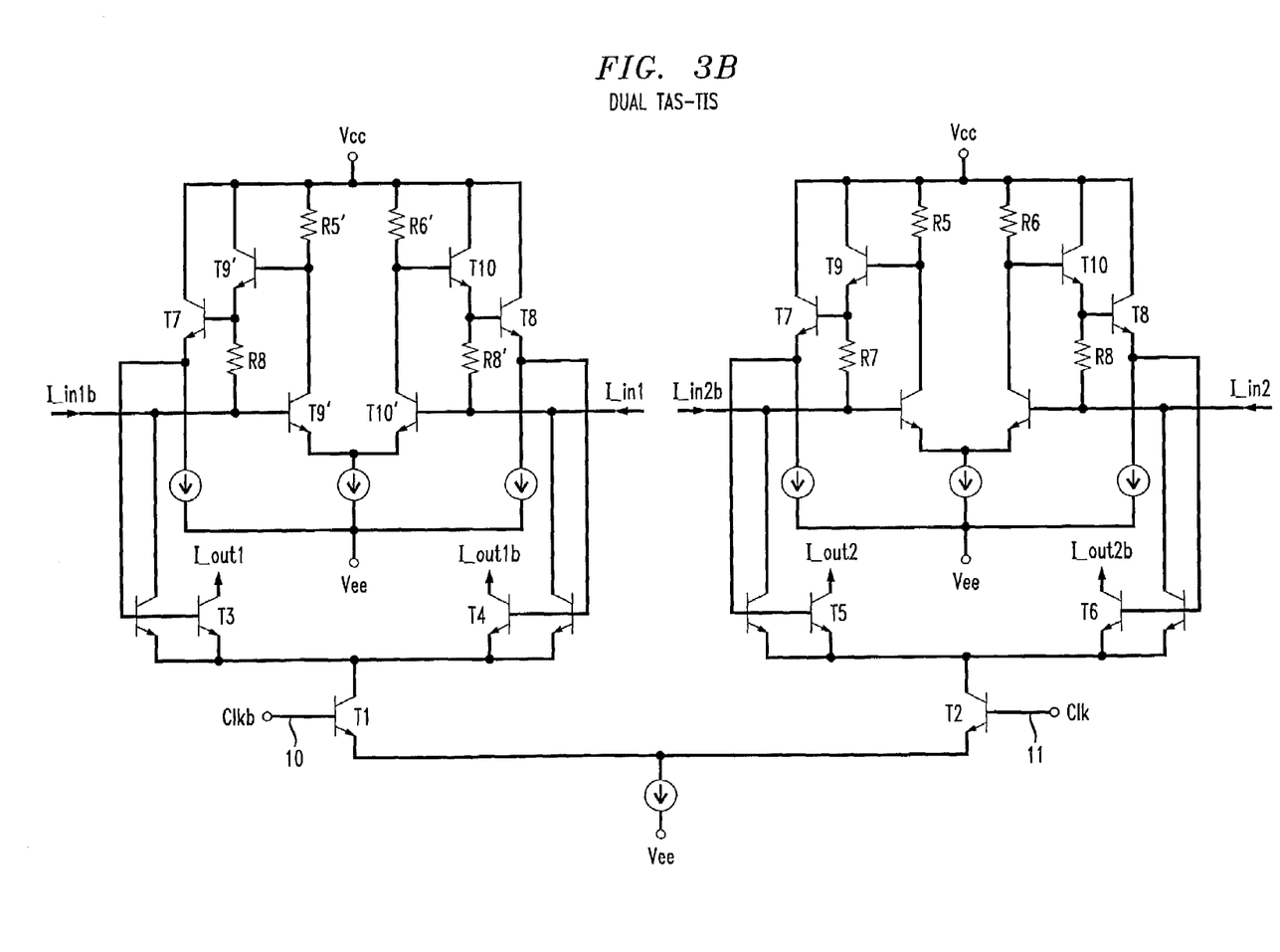
FIG. 3b is an exemplary TAS-TIS latch pair comprising two independent TAS-TIS stages.
Figure 3C:
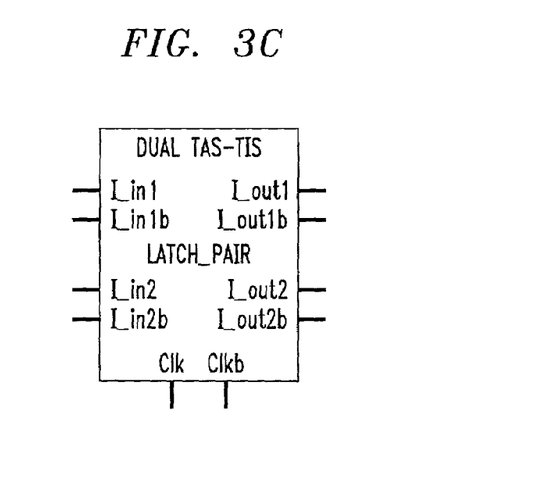
FIG. 3c is a logic gate symbol for the TAS-TIS latch pair of FIG. 3b.

For efficient use of power and area two independent TAS-TIS stages may be grouped in the same block. FIG. 3b shows a latch pair comprising two, independent TAS TIS stages, wherein the two stages are clocked on opposite phases of a clock signal clk (clock) and clkb (clock bar). FIG. 3c is a digital logic circuit symbol of the two stage TAS-TIS latch pair.

Figure 4A:
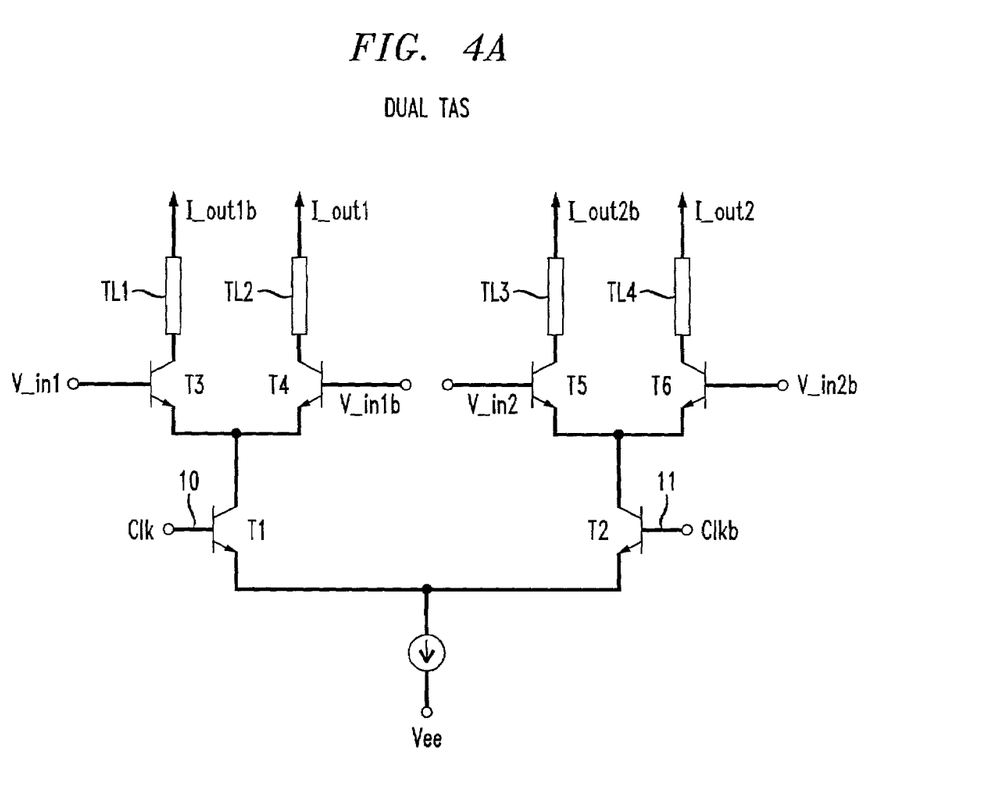
FIG. 4a is a clocked TAS latch.
Figure 4B:
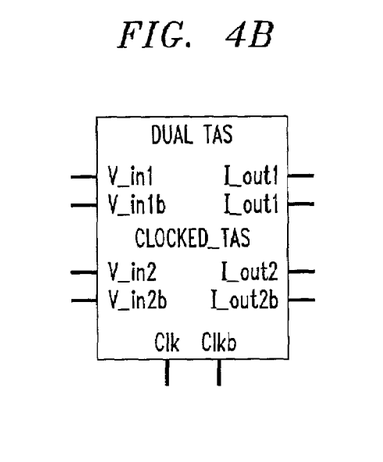

FIG. 4a is a two stage clocked TAS latch in accordance with the invention which receives an input voltage Vin1, Vin1b, Vin2, Vin2b and produces an output current Iout1, Iout1b, Iou2, Iout2b. Transmission lines TL1, TL2, TL3, TL4 may be coupled between the outputs of the TAS circuit and the inputs of the TIS circuit. The nominal frequency range of oscillation of the overall circuit may be adjusted by selecting the length of the transmission lines TL1, TL2, TL3, TL4. A clock signal acts as a selector between Vin1, Vin2. In particular, when the clock signal (clk) is active, the input voltage Vin1, Vin1b is output as current Iout1, Iout1b, whereas when clock bar signal (clkb) is active, the input voltage Vin2, Vin2b is output as Iout2, Iout2b. The logic gate symbol of the two stage clocked TAS latch is shown in FIG. 4b.

Figure 5A:
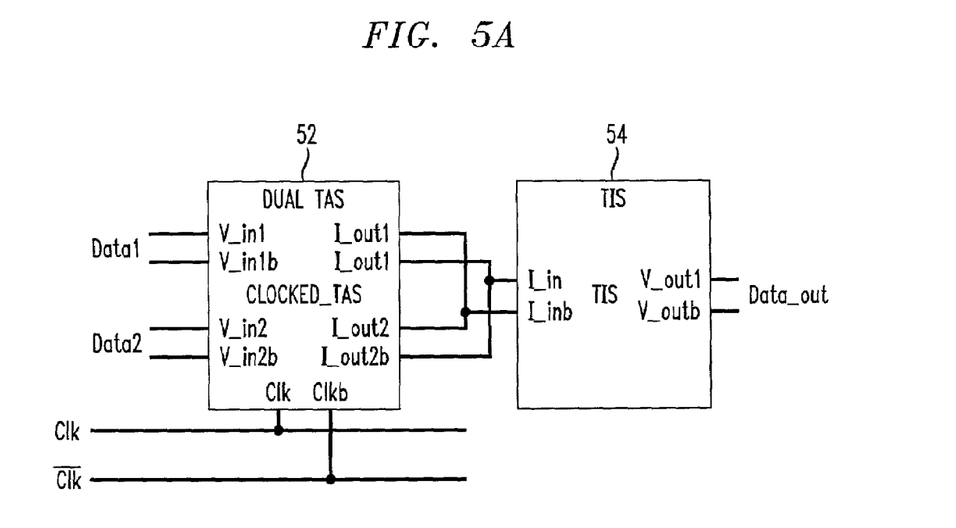
FIGS. 5a–5c are exemplary functional blocks with logic gates in accordance with the present invention.
Figure 5B:
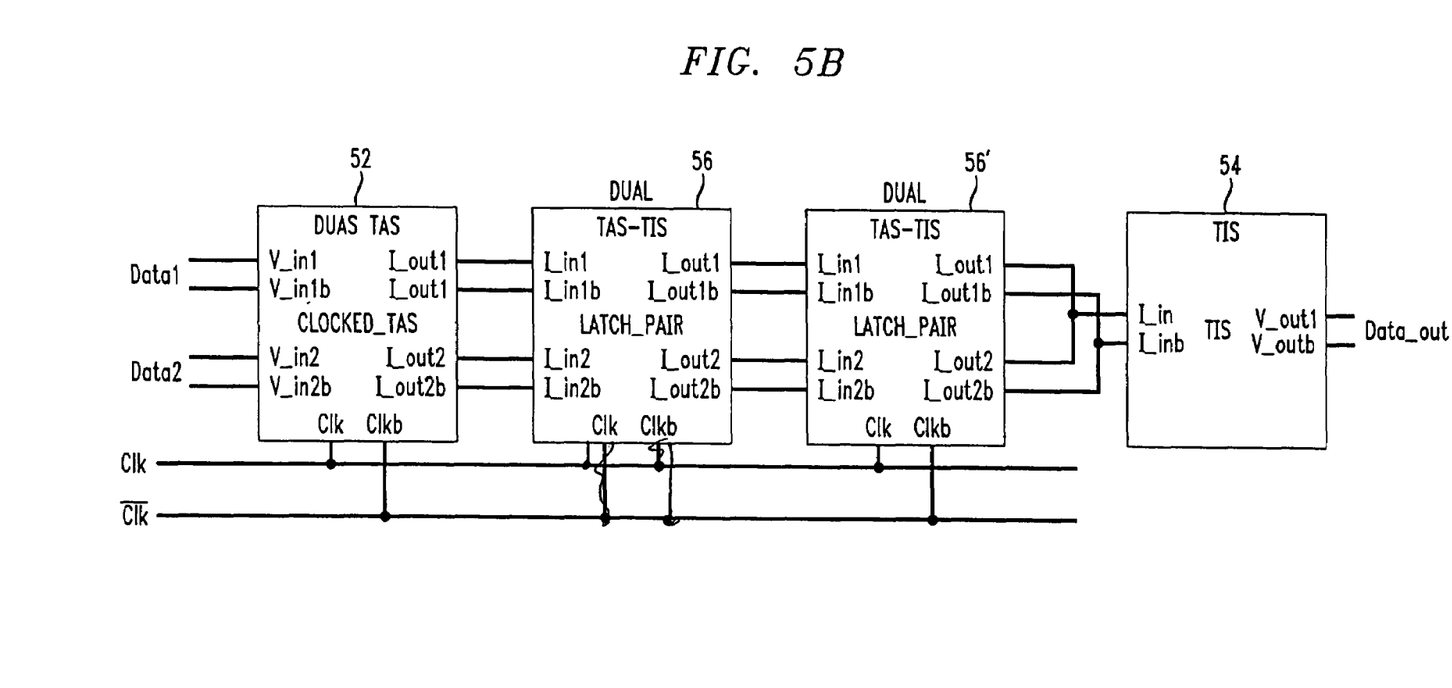
Figure 5C:
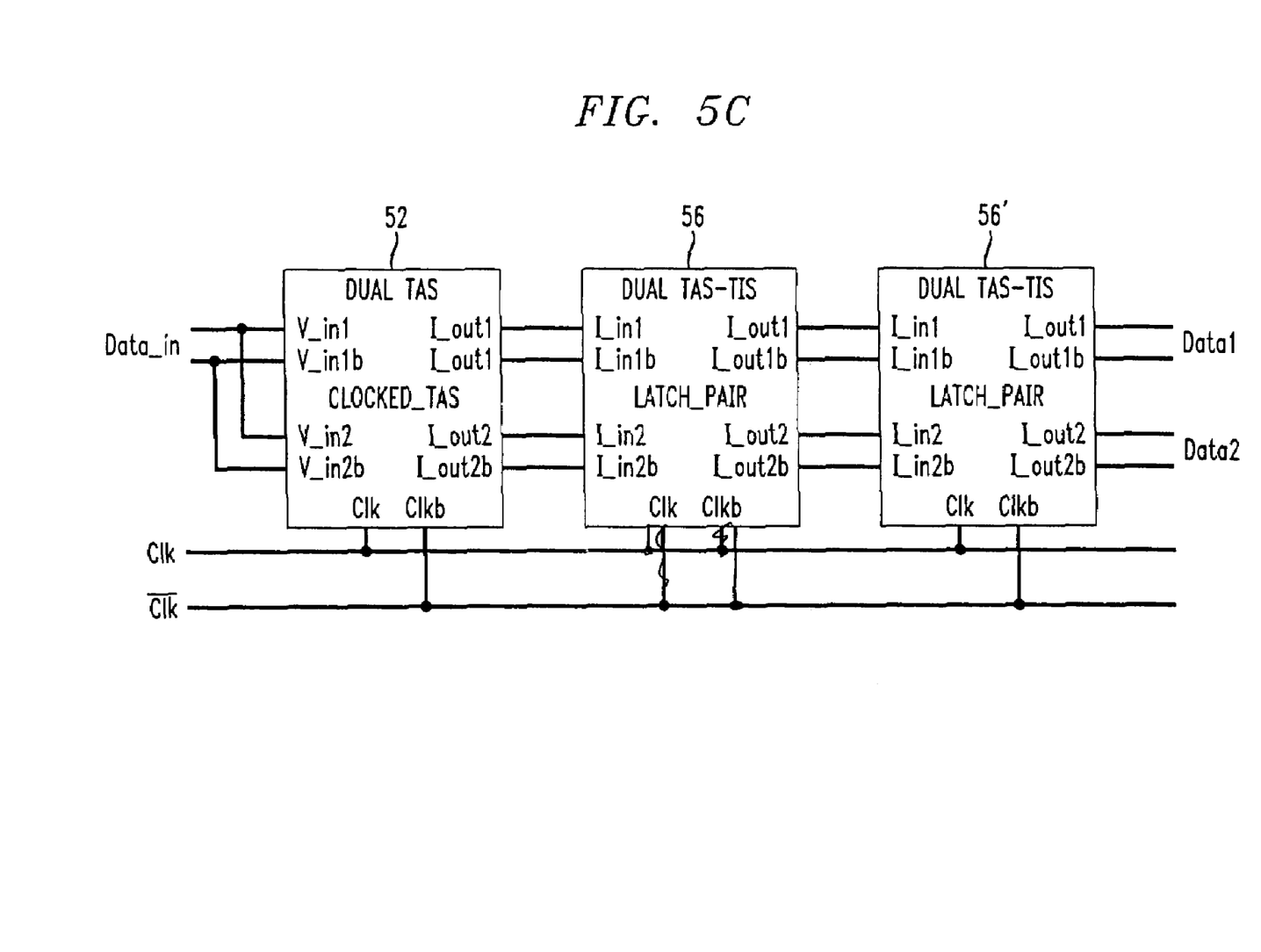

The modified logic gates in accordance with the present invention have a wide range of functional applications. By way of example, in FIG. 5a, a clocked TAS latch is coupled with a TIS latch to form a two-in-one selector for voltages. The clocked TAS latch selectively receives two input voltages Vin1 and Vin2 and produces output current Iout1, Iout1b, Iout2, Iout2b. The TIS latch selectively receives as a current input Iin, Iinb from the output current Iout1, Iout1b, Iout2, Iout2b of the clocked TAS and produces a single voltage output Vout1, Voutb. In another exemplary application of the logic gates in accordance with the present invention, FIG. 5b shows a two-to-one multiplexer of a cascaded chain comprising a clocked TAS, two TAS-TIS latch pairs and a TIS latch, while FIG. 5c shows the reverse processing of a one-to-two demultiplexer. Other functional applications of the logic circuit in accordance with the present invention are contemplated and within the intended scope of the invention.

The logic gate in accordance with the present invention provides more gain at higher bandwidth than conventional logic gates. Line impedance and TIS input impedance are selected to minimize reflections and adsorb the line capacitance, thereby increasing the peak clock frequency.

Thus, while there have been shown, described, and pointed out fundamental novel features of the invention as applied to a preferred embodiment thereof, it will be understood that various omissions, substitutions, and changes in the form and details of the devices illustrated, and in their operation, may be made by those skilled in the art without departing from the spirit and scope of the invention. For example, it is expressly intended that all combinations of those elements and/or steps which perform substantially the same function, in substantially the same way, to achieve the same results are within the scope of the invention. Substitutions of elements from one described embodiment to another are also fully intended and contemplated. It is also to be understood that the drawings are not necessarily drawn to scale, but that they are merely conceptual in nature. It is the intention, therefore, to be limited only as indicated by the scope of the claims appended hereto.

What is claimed is:

1. A latch comprising:
   a clocked trans-admittance stage circuit for producing a current output responsive to an input voltage; and
   an active load connected to receive input data and said current output as input and produce a voltage output that is received by said clocked trans-admittance stage circuit to control at least one element thereof to provide a data output.

2. The latch in accordance with claim 1, wherein the active load is a trans-impedance stage circuit.

3. The latch in accordance with claim 1, wherein said trans-admittance stage circuit comprises:
   a first pair of transistors including a first transistor and a second transistor, the first and second transistors each having a base, an emitter, and a collector;
   a current source connected to the emitter of each of said first and second transistors;
   a second pair of transistors including a third transistor and a fourth transistor, each of said third and fourth transistors having a base, an emitter, and a collector, and the emitter of each of said third and fourth transistors being connected to the collector of said first transistor; and
   a third pair of transistors including a fifth transistor and a sixth transistor, each of said fifth and sixth transistors having a base, an emitter, and a collector; and the emitter of each of said fifth and sixth transistors being connected to the collector of said second transistor.

4. The latch in accordance with claim 3, wherein the base of said first and second transistors are clocked on opposite phases of a clock signal.

5. The latch in accordance with claim 4, wherein the base of said third transistor receives as input a voltage signal and the base of said fourth transistor receives as input an inverted voltage signal, said third transistor produces a current output signal based on the inverted voltage signal, and said fourth transistor produces an inverted current output signal based on the voltage signal.

6. The latch in accordance with claim 1, further comprising transmission lines coupled between said clocked trans-admittance circuit and said active load.

7. A cascaded latch chain comprising:
- a clocked trans-admittance stage latch configured to produce an output current responsive to an input voltage; and
- at least one latch pair configured to receive an input data and the output current and provide a voltage output to control at least one element of said clocked trans-admittance stage latch to provide a data output.

8. The cascaded latch chain in accordance with claim 7, wherein said at least one latch pair includes two combined trans-admittance and additional trans-impedance stages.

9. The cascaded latch chain in accordance with claim 8, comprising at least two latch pairs including a first latch pair and a last latch pair, each latch pair having two trans-admittance and trans-impedance stages, the two trans-admittance and trans-impedance stages of each latch pair being clocked on opposite phases of a clock signal.

10. The cascaded latch chain in accordance with claim 9, wherein said trans-admittance stage in each latch pair comprises:
- a first pair of transistors including a first transistor and a second transistor, the first and second transistors each having a base, an emitter, and a collector;
- a current source connected to the emitter of each of said first and second transistors; a
- second pair of transistors including a third transistor and a fourth transistor, each of said third and fourth transistors having a base, an emitter, and a collector, and the emitter of each of said third and fourth transistors being connected to the collector of said first transistor, and
- a third pair of transistors including a fifth transistor and a sixth transistor, each of said fifth and sixth transistors having a base, an emitter, and a collector; and the emitter of each of said fifth and sixth transistors being connected to the collector of said second transistor.

11. The cascaded latch chain in accordance with claim 9, wherein the two trans-admittance and trans-impedance stages in said at least one latch pair are clocked on opposite phases of a clock signal.

12. The cascaded latch chain in accordance with claim 7, further comprising a trans impedance stage latch connected to receive the output current of a final latch pair and produce an output voltage.

13. The cascaded latch chain in accordance with claim 8, further comprising a trans impedance stage latch connected to receive the output current of a final latch pair and produce an output voltage.

14. A latch pair comprising:
- a first combined trans-admittance and trans-impedance stage coupled to an independently clocked second combined trans-admittance and trans-impedance stage, wherein each of said first and said second combined stages have an input and an output, and at least one of said combined trans-admittance and trans-impedance stages has a clocked trans-admittance stage circuit for producing a current output responsive to an input voltage; and
- an active load configured to receive input data and said current output and produce a voltage output that is received by said clocked trans-admittance stage circuit to control at least one element thereof to provide a data output.

15. The latch pair in accordance with claim 14, wherein each trans-admittance stage of said first and said second combined stages comprises:
- a first pair of transistors including a first transistor and a second transistor, the first and second transistors each having a base, an emitter, and a collector;
- a current source connected to the emitter of each of said first and second transistors;
- a second pair of transistors including a third transistor and a fourth transistor, each of said third and fourth transistors having a base, an emitter, and a collector; and the emitter of each of said third and fourth transistors being connected to the collector of said first transistor; and
- a third pair of transistors including a fifth transistor and a sixth transistor, each of said fifth and sixth transistors having a base, an emitter, and a collector, and the emitter of each of said fifth and sixth transistors being connected to the collector of said second transistor.

16. The latch pair in accordance with claim 14, wherein said first and said second combined stages are clocked on opposite phases of a clock signal.

17. The latch in accordance with claim 1 wherein said active load is coupled to Vcc.

18. The latch pair in accordance with claim 14 wherein trans-admittance stages of said first and said second combined stages have transistors with collectors that lack a common coupling point.

19. The latch pair in accordance with claim 14 wherein transistors of a trans-admittance stage of said first combined stage have collectors directly coupled to said input and said output of said first combined stage.

* * * * *